United States Patent
Oka et al.

(10) Patent No.: US 12,065,759 B2
(45) Date of Patent: Aug. 20, 2024

(54) INDIUM PHOSPHIDE SUBSTRATE

(71) Applicant: JX METALS CORPORATION, Tokyo (JP)

(72) Inventors: Shunsuke Oka, Kitaibaraki (JP); Kenji Suzuki, Kitaibaraki (JP)

(73) Assignee: JX METALS CORPORATION, Tokyo (JP)

( * ) Notice: Subject to any disclaimer, the term of this patent is extended or adjusted under 35 U.S.C. 154(b) by 201 days.

(21) Appl. No.: 17/787,197

(22) PCT Filed: Mar. 7, 2022

(86) PCT No.: PCT/JP2022/009815
§ 371 (c)(1),
(2) Date: Jun. 17, 2022

(87) PCT Pub. No.: WO2023/037597
PCT Pub. Date: Mar. 16, 2023

(65) Prior Publication Data
US 2023/0082020 A1    Mar. 16, 2023

(30) Foreign Application Priority Data

Sep. 7, 2021    (JP) .................................. 2021-145784

(51) Int. Cl.
*C30B 29/40*    (2006.01)
*C30B 33/10*    (2006.01)
(Continued)

(52) U.S. Cl.
CPC .............. *C30B 29/40* (2013.01); *C30B 33/10* (2013.01); *H01L 21/02021* (2013.01); *H01L 21/304* (2013.01); *H01L 29/20* (2013.01)

(58) Field of Classification Search
CPC ............... C30B 33/00; H01L 21/02021; H01L 21/02013; H01L 21/304
See application file for complete search history.

(56) References Cited

U.S. PATENT DOCUMENTS 6,294,019 B1 *   9/2001   Miura ............... H01L 21/76264
                                                                    117/97
2004/0113236 A1   6/2004   Kurita et al.
(Continued)

FOREIGN PATENT DOCUMENTS

CN    113206007 A    8/2021
EP    1 189 266 A1   3/2002
(Continued)

OTHER PUBLICATIONS

International Preliminary Report on Patentability and English translation of the Written Opinion of the International Searching Authority (Forms PCT/IB/373 and PCT/ISA/237) for International Application No. PCT/JP2022/009815, dated Mar. 5, 2024.
(Continued)

*Primary Examiner* — Jaehwan Oh
(74) *Attorney, Agent, or Firm* — Birch, Stewart, Kolasch & Birch, LLP

(57) ABSTRACT

An indium phosphide substrate, the phosphide substrate has an angle θ on the main surface side of 0°<θ≤120° for all of the planes A, the indium phosphide substrate has edge rounds on the main surface side and a surface side opposite to the main surface; wherein a chamfered width $X_f$ from the wafer edge on the main surface side is 50 μm or more to 130 μm or less; wherein a chamfered width $X_b$ from the wafer edge on the surface side opposite to the main surface is 150 μm or more to 400 μm or less; and wherein the indium phosphide substrate has a thickness of 330 μm or more to 700 μm or less.

7 Claims, 5 Drawing Sheets

(51) Int. Cl.
*H01L 21/02* (2006.01)
*H01L 21/304* (2006.01)
*H01L 29/20* (2006.01)

(56) References Cited

U.S. PATENT DOCUMENTS

2015/0184314 A1 7/2015 Narahara et al.
2019/0189421 A1* 6/2019 Yoshida .................. B24B 57/02
2022/0097200 A1* 3/2022 Torii ........................ B24B 9/00
2022/0208549 A1* 6/2022 Oka ................. H01L 21/02016

FOREIGN PATENT DOCUMENTS

| | | |
|---|---|---|
| EP | 3 933 077 A1 | 1/2022 |
| JP | 2003-218033 A | 7/2003 |
| JP | 2006-203071 A | 8/2006 |
| JP | 2007-42748 A | 2/2007 |
| JP | 2008-177233 A | 7/2008 |
| WO | 2021/153120 A1 | 8/2021 |

OTHER PUBLICATIONS

International Search Report for PCT/JP2022/009815 (PCT/ISA/210) mailed on Apr. 12, 2022.
Written Opinion of the International Searching Authority for PCT/JP2022/009815 (PCT/ISA/237) mailed on Apr. 12, 2022.

* cited by examiner

INDIUM PHOSPHIDE SUBSTRATE

FIELD OF THE INVENTION

The present invention relates to an indium phosphide substrate.

BACKGROUND OF THE INVENTION

Indium phosphide (InP) is a Group III-V compound semiconductor material composed of indium (In) of Group III and phosphorus (P) of Group V. The semiconductor material has characteristics in which a band gap is 1.35 eV and an electron mobility is about 4600 cm$^2$/V·s at room temperature, and the electron mobility under a high electric field is higher than that of other general semiconductor materials such as silicon and gallium arsenide. Further, the semiconductor material has characteristics in which its stable crystal structure under ordinary temperature and ordinary pressure is a cubic sphalerite type structure, and its lattice constant is larger than that of a compound semiconductor such as gallium arsenide (GaAs) and gallium phosphide (GaP).

An indium phosphide ingot which is a raw material for the indium phosphide substrate is generally sliced to have a predetermined thickness, ground to have a desired shape, mechanically polished as needed, and then subjected to etching or precision polishing in order to remove polishing debris and damage caused by polishing.

A main surface of the indium phosphide substrate may be provided with an epitaxial crystal layer by epitaxial growth (Patent Literature 1).

CITATION LIST

Patent Literature

[Patent Literature 1] Japanese Patent Application Publication No. 2003-218033 A

SUMMARY OF THE INVENTION

Technical Problem

After the epitaxial growth is carried out, the substrate is polished from the back surface of the wafer by a method such as back lapping to decrease a thickness of the substrate to, for example, 100 µm or more to 200 µm or less, because the thickness of the substrate is no longer necessary when subsequent steps are further carried out. Here, since an edge of the wafer is generally sharp, the edge is further sharpened when the substrate is polished from the back surface of the wafer using the method such as back surface polishing (also called back lapping), which causes a problem that the wafer is easily cracked.

There is a technique to address such a problem, which suppresses the sharpness of the edge portion upon polishing from the back surface of the wafer using a method such as back lapping by controlling the chamfered width of the chamfered portion on the surface of the wafer and the radius R of the arc portion. In this case, the chamfered portion of the wafer is generally designed to be vertically symmetrical, so that the back surface of the wafer is also polished to the same shape.

In general, the indium phosphide substrate is subjected to mirror polishing for epitaxial growth. A typical method of the mirror polishing is to melt a resin wax or the like on a ceramic plate, uniformly apply it to a back surface side of a wafer using a spin coat or the like to have a thickness of 1 to 2 µm, and polish it while attaching the wafer to the ceramic plate, in terms of flatness or the like. Even if both sides of the wafer are subjected to mirror polishing, it is desirable that after polishing by rotating and revolving the wafer while sandwiching it between upper and lower surface plates, the back surface of the wafer is polished while attaching the back surface to the ceramic plate using the same method as described above, for the purposes of reducing damages during the polishing of the both sides and removing minute scratches on the surface. After polishing, the wafer is peeled off from the ceramic plate and washed. The peeling method includes a method of melting a resin wax by applying heat, and method of inserting a jig such as a scraper on the back surface side and peeling off the wafer using the lever rule; the peeling method using the scraper is simple and common in terms of work.

In this case, when controlling the chamfered width of the chamfered portion on the front surface of the wafer and the radius R of the arc portion as described above, the back surface of the wafer polished to have the same shape will have the same degree of the chamfered width on the back surface side as the chamfered width of the front surface side. Here, if the chamfered width on the front surface side is narrower, the chamfered width on the back surface side is also narrower, so that chipping may occur on the back surface side of the wafer during the peeling work of the wafer from the ceramic plate after mirror polishing.

The present invention has been made to solve the above problems. An object of the present invention is to provide an indium phosphide substrate capable of satisfactorily suppressing generation of chipping when the plate used for polishing is peeled off from the back surface side of the wafer after mirror polishing of the front surface of the wafer.

Solution to Problem

Embodiments according to the present invention are defined by the following aspects (1) to (5):

(1)

An indium phosphide substrate, wherein when planes A each parallel to a main surface are taken in a wafer, the phosphide substrate has an angle θ on the main surface side of 0°<θ≤120° for all of the planes A where a distance from the main surface is 100 µm or more to 200 µm or less, wherein the angle θ is formed by a plane B, the plane B including an intersection line of an wafer edge with each of the planes A and being tangent to the wafer edge, and an plane of each of the planes A extending in a wafer outside direction;

wherein in a cross section orthogonal to the wafer edge, the indium phosphide substrate has edge rounds on the main surface side and a surface side opposite to the main surface;

wherein a chamfered width $X_f$ from the wafer edge on the main surface side is 50 µm or more to 130 µm or less;

wherein a chamfered width $X_b$ from the wafer edge on the surface side opposite to the main surface is 150 µm or more to 400 µm or less; and wherein the indium phosphide substrate has a thickness of 330 µm or more to 700 µm or less.

(2)

The indium phosphide substrate according to (1), wherein the angle θ is 60° ≤θ≤120° for all of the planes A where the distance from the main surface is 100 μm or more to 200 μm or less.

(3)

An indium phosphide substrate,
  wherein when planes A each parallel to a main surface are taken in a wafer, the phosphide substrate has an angle θ on the main surface side of 60°<θ≤110° for all of the planes A where a distance from the main surface is 100 μm or more to 200 μm or less, wherein the angle θ is formed by a plane B, the plane B including an intersection line of an wafer edge with each of the planes A and being tangent to the wafer edge, and an plane of each of the planes A extending in a wafer outside direction;
  wherein in a cross section orthogonal to the wafer edge, the indium phosphide substrate has edge rounds on the main surface side and a surface side opposite to the main surface;
  wherein a chamfered width $X_f$ from the wafer edge on the main surface side is 80 μm or more to 110 μm or less;
  wherein a chamfered width $X_b$ from the wafer edge on the surface side opposite to the main surface is 150 μm or more to 210 μm or less; and
  wherein the indium phosphide substrate has a diameter of 50.8 mm or less and a thickness of 330 μm or more to 380 μm or less.

(4)

An indium phosphide substrate,
  wherein when planes A each parallel to a main surface are taken in a wafer, the phosphide substrate has an angle θ on the main surface side of 90°≤θ≤120° for all of the planes A where a distance from the main surface is 100 μm or more to 200 μm or less, wherein the angle θ is formed by a plane B, the plane B including an intersection line of a wafer edge with each of the planes A and being tangent to the wafer edge, and an plane of each of the planes A extending in a wafer outside direction,
  wherein in a cross section orthogonal to the wafer edge, the indium phosphide substrate has edge rounds on the main surface side and a surface side opposite to the main surface;
  wherein a chamfered width $X_f$ from the wafer edge on the main surface side is 80 μm or more to 110 μm or less;
  wherein a chamfered width $X_b$ from the wafer edge on the surface side opposite to the main surface is 180 μm or more to 230 μm or less; and
  wherein the indium phosphide substrate has a diameter of 50.8 mm or less and a thickness of 480 μm or more to 530 μm or less.

(5)

An indium phosphide substrate,
  wherein when planes A each parallel to a main surface are taken in a wafer, the phosphide substrate has an angle θ on the main surface side of 90°≤θ≤120° for all of the planes A where a distance from the main surface is 100 μm or more to 200 μm or less, wherein the angle θ is formed by a plane B, the plane B including an intersection line of an wafer edge with each of the planes A and being tangent to the wafer edge, and an plane of each of the planes A extending in a wafer outside direction;
  wherein in a cross section orthogonal to the wafer edge, the indium phosphide substrate has edge rounds on the main surface side and a surface side opposite to the main surface;
  wherein a chamfered width $X_f$ from the wafer edge on the main surface side is 90 μm or more to 130 μm or less;
  wherein a chamfered width $X_b$ from the wafer edge on the surface side opposite to the main surface is 270 μm or more to 350 μm or less; and
  wherein the indium phosphide substrate has a diameter of 76.2 mm or less and a thickness of 570 μm or more to 630 μm or less.

(6)

The indium phosphide substrate according to any one of (1) to (5), wherein a ratio of the chamfered width $X_b$ from the wafer edge on the surface side opposite to the main surface to the chamfered width $X_f$ from the wafer edge on the main surface side: $X_b/X_f$ is 1.25 or more to 8.0 or less.

(7)

The indium phosphide substrate according to (6), wherein the ratio $X_b/X_f$ is 1.70 or more to 3.0 or less.

Advantageous Effects of Invention

According to the embodiments of the present invention, it is possible to provide an indium phosphide substrate capable of satisfactorily suppressing generation of chipping when the plate used for polishing is peeled off from the back surface side of the wafer after mirror polishing of the front surface of the wafer.

DETAILED DESCRIPTION OF THE INVENTION

[Indium Phosphide Substrate]

Hereinafter, a structure of an indium phosphide substrate according to the present embodiment will be described.

The indium phosphide (InP) substrate according to the present embodiment includes a main surface for forming an epitaxial crystal layer and a back surface side opposite to the main surface.

The main surface for forming the epitaxial crystal layer is a surface for actually carrying out epitaxial growth when the indium phosphide substrate according to the embodiment is used as a substrate for epitaxial growth in order to form a semiconductor device structure.

The main surface of the indium phosphide substrate may have a maximum diameter of from 49 to 151 mm or from 49 to 101 mm, although not particularly limited thereto. A planar shape of the indium phosphide substrate may be circular or rectangular such as a quadrangle.

The indium phosphide substrate preferably has a thickness of from 300 to 900 μm, and more preferably 300 to 700 μm, for example, although not particularly limited thereto.

Particularly when the diameter is higher, there may be problems that the indium phosphide substrate may be cracked if the substrate has a thickness of less than 300 µm, and a base crystal may be wasted if the substrate has a thickness of more than 900 µm.

The indium phosphide substrate may contain, as a dopant (impurity), Zn (zinc) such that a carrier concentration is $1 \times 10^{16}$ cm$^{-3}$ or more to $1 \times 10^{19}$ cm$^{-3}$ or less, and/or S (sulfur) such that a carrier concentration is $1 \times 10^{16}$ cm$^{-3}$ or more to $1 \times 10^{19}$ cm$^{-3}$ or less, and/or Sn (tin) such that a carrier concentration is $1 \times 10^{16}$ cm$^{-3}$ or more to $1 \times 10^{19}$ cm$^{-3}$ or less, and/or Fe (iron) such that a carrier concentration is $1 \times 10^{6}$ cm$^{-3}$ or more to $1 \times 10^{9}$ cm$^{-3}$ or less.

In one aspect, when planes A each parallel to a main surface are taken in a wafer, the indium phosphide substrate according to the present embodiment has an angle θ on the main surface side of $0° < θ ≤ 120°$ for all of the planes A where a distance from the main surface is 100 µm or more to 200 µm or less, wherein the angle θ is formed by a plane B, the plane B including an intersection line of an wafer edge with each of the planes A and being tangent to the wafer edge, and an plane of each of the planes A extending in a wafer outside direction.

Figure 1:
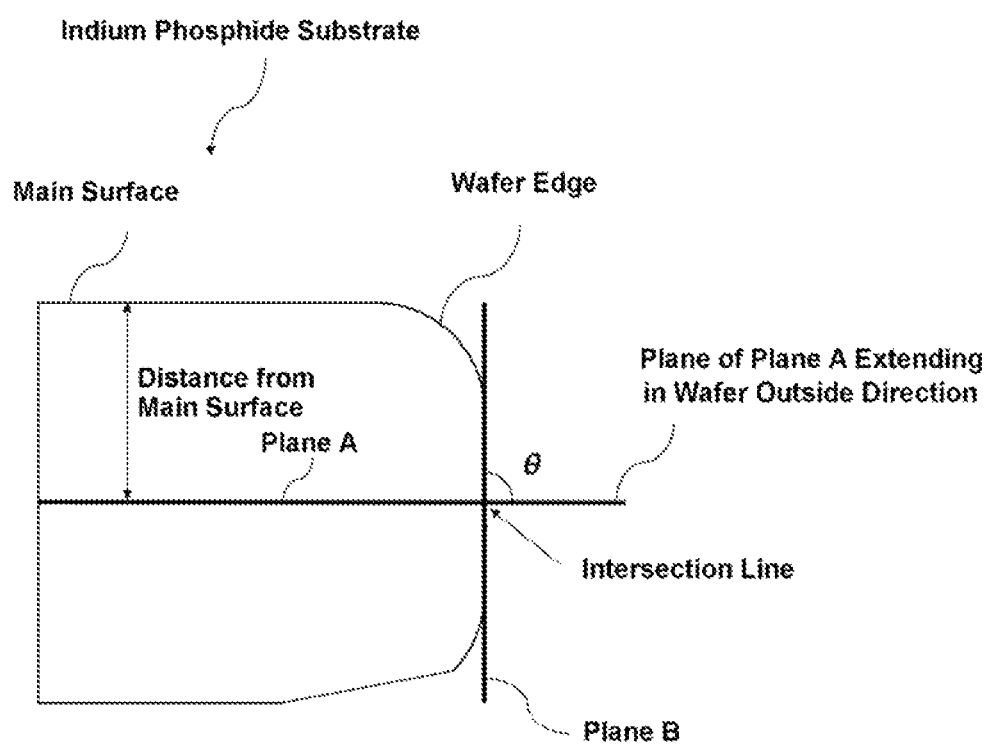
FIG. 1 is a schematic cross-sectional view of an indium phosphide substrate near a wafer edge.
Figure 2:
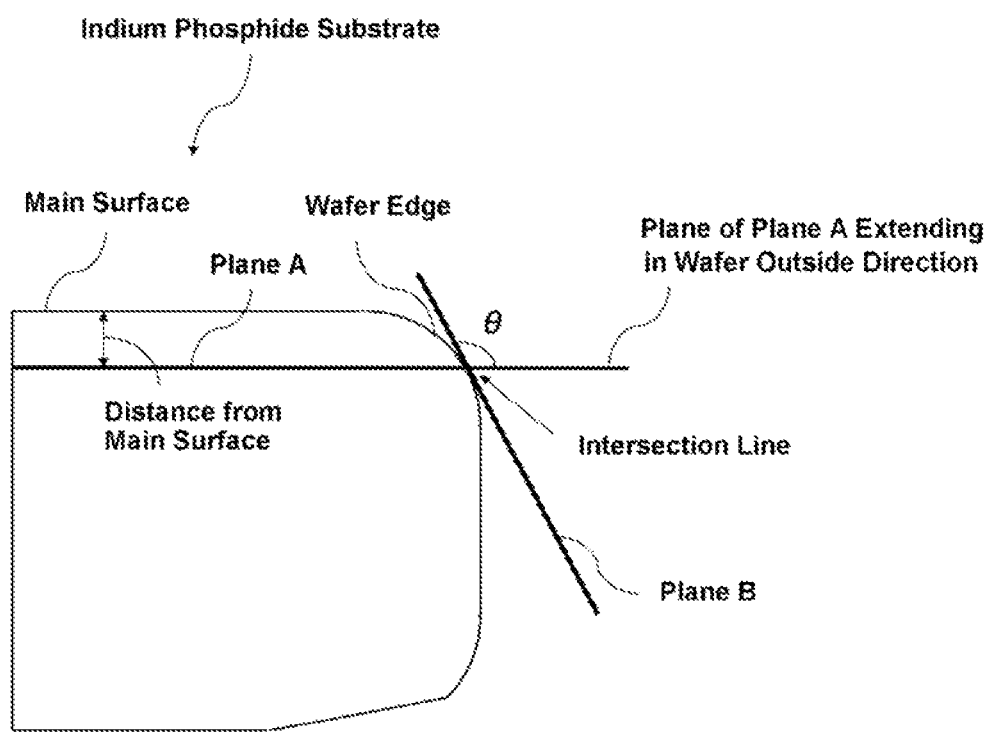
FIG. 2 is a schematic cross-sectional view of an indium phosphide substrate near a wafer edge.
Figure 3:
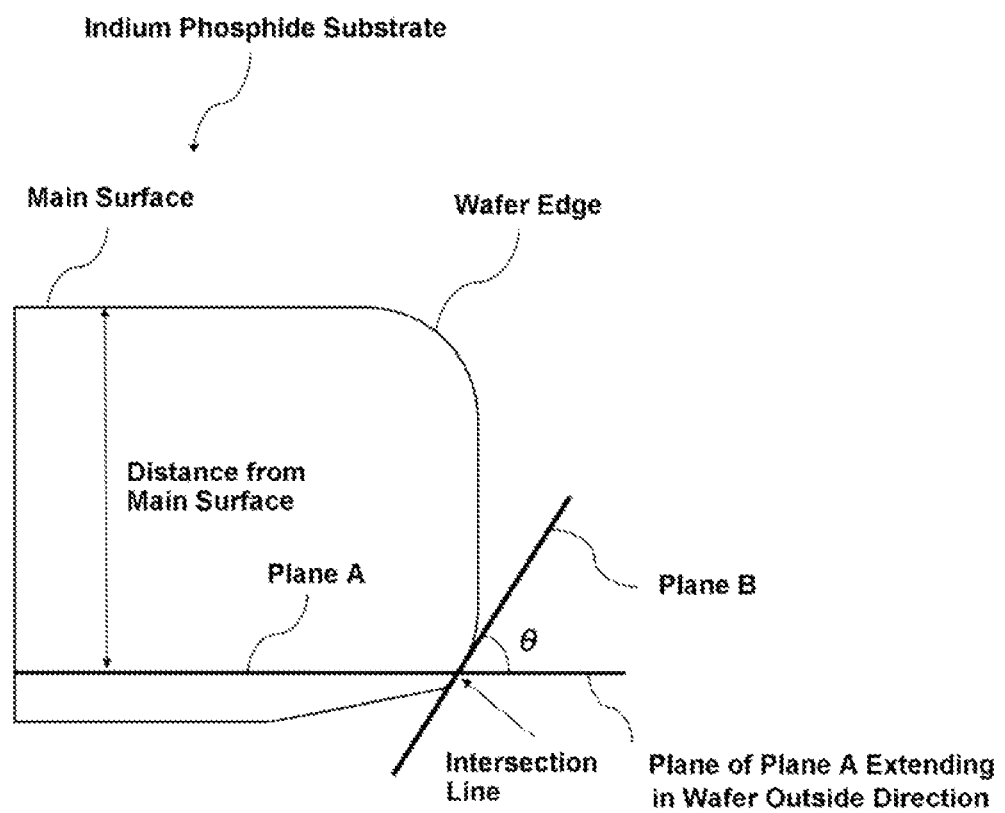
FIG. 3 is a schematic cross-sectional view of an indium phosphide substrate near a wafer edge.

In order to understand the planes A, B, and angles θ, and the like, as described above, each of FIGS. 1-3 shows a cross-sectional schematic view near a wafer edge of an indium phosphide substrate. A cross section of the wafer edge of the indium phosphide substrate is curved by cutting (chamfering) corners of the rectangle as shown in each of FIGS. 1-3. Therefore, the size of the above angle θ varies depending on portions of the wafer taken as the planes A. As the angle θ is close to 180°, the wafer edge will be sharper. It should be noted that each of FIGS. 1 to 3 is for understanding the planes A, B, intersections, and angles θ in the indium phosphide substrate according the present invention, and it does not directly represent the indium phosphide substrate according the present invention. As used herein, the "wafer edge" refers to a side surface of the indium phosphide substrate, i.e., an outer surface excluding the main surface and the back surface.

In the example as shown in FIG. 1, the plane A is taken at the center of the wafer in the thickness direction. Therefore, the angle θ formed by the plane B, which includes the intersection line of the wafer edge with the plane A and is tangent to the wafer edge, and a plane of the plane A extending in the wafer outside direction is 90°.

In the example as shown in FIG. 2, the plane A is taken at the upper portion of the wafer in the thickness direction. Thus, when the plane A is taken at the upper portion of the wafer in the thickness direction, the angle θ formed by the plane B, which includes the intersection line of the wafer edge with the plane A and is tangent to the wafer edge, and a plane extending from the plane A to the outside of the wafer is an obtuse angle ($90° < θ < 180°$).

In the example as shown in FIG. 3, the plane A is taken at the lower portion of the wafer in the thickness direction. Thus, when the plane A is taken at the lower portion of the wafer in the thickness direction, the angle θ formed by the plane B, which includes the intersection line of the wafer edge with the plane A and is tangent to the wafer edge, and a plane extending from the plane A to the outside of the wafer is an acute angle ($0° < θ < 90°$).

In the indium phosphide substrate according to the present invention, each of the angles θ on the main surface side is controlled to be $0° < θ ≤ 120°$ for all of the planes A where the distance from the main surface is 100 µm or more to 200 µm or less. According to the configuration, when the indium phosphide substrate is polished from the back surface of the wafer to the plane A by a method such as back lapping, the sharpness of the wafer edge is suppressed. Therefore, any damage such as cracking on the wafer edge during process or the like can be well suppressed. The angle θ is preferably controlled to be $60° ≤ θ ≤ 120°$ for all of the planes A where the distance from the main surface is 100 µm or more to 200 µm or less.

As described above, the plane B includes the intersection line of the wafer edge with each of the planes A and is tangent to the wafer edge. However, even if the intersection line of the wafer edge with the plane A is determined, the value of the angle θ on the main surface side formed by the plane B and the plane of the plane A extending in the wafer outside direction varies to some extent depending on a degree of surface roughness of the wafer edge. It is believed that the variation of the angle θ due to the surface roughness of the wafer edge has a very small impact on, in particular, the suppression of the sharpness of the wafer edge that occurs when polishing is carried out from the back surface of the wafer using the method such as back lapping, which is an effect of the present invention. Each angle θ defined in the present invention is measured by observing the shape of the wafer edge with Wafer Edge Profile Checker (EPRO-212EO manufactured by YUHI ELECTRONICS) as described below. The plane B may be a plane measured at any degree of accuracy that can be measured using the Wafer Edge Profile Checker, regardless of the surface roughness of the wafer edge.

In the present embodiment, the planes A are all planes A where the distance from the main surface is 100 µm or more to 200 µm or less. This is because the above effect can be obtained to a thickness such that the distance from the main surface is 100 µm or more to 200 µm or less, for the indium phosphide substrate polished from the back surface of the wafer by the method such as back lapping. Also, the thickness of the indium phosphide substrate according to the present embodiment is 330 µm or more to 700 µm or less.

Figure 4:
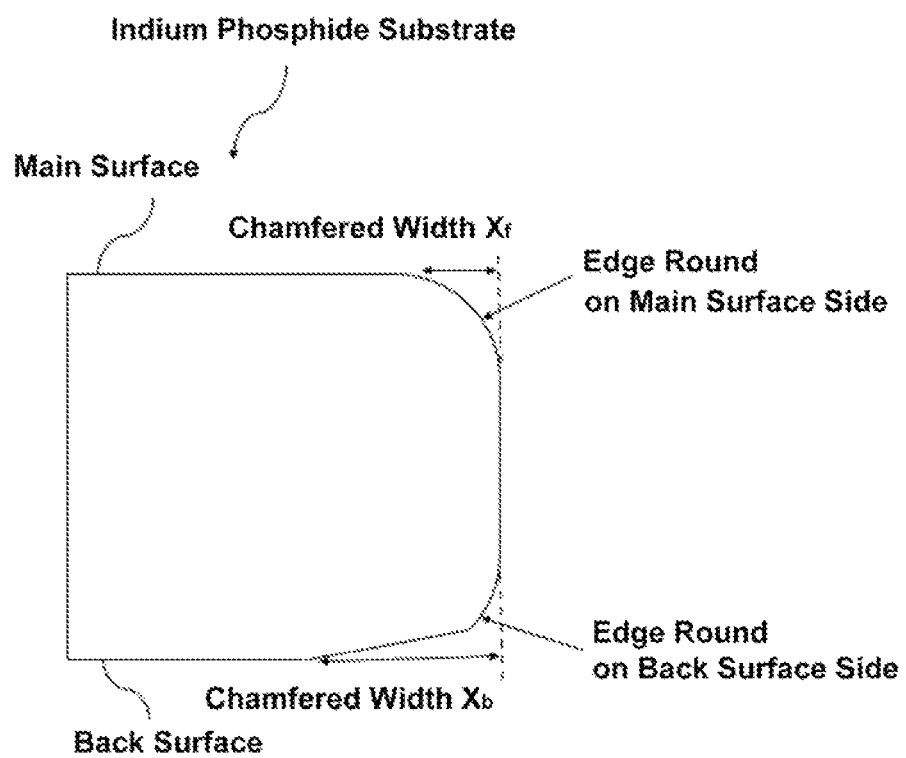
FIG. 4 is a schematic cross-sectional view for explaining edge rounds of an indium phosphide substrate.

In a cross section orthogonal to the wafer edge, the indium phosphide substrate according the present embodiment has edge rounds on the main surface side and a surface side opposite to the main surface (back surface side), as shown in FIG. 4. Further, the chamfered width $X_f$ from the wafer edge on the main surface side is controlled to 50 µm or more to 130 µm or less, and the chamfered width $X_b$ from the wafer edge on the back surface side is controlled to 150 µm or more to 400 µm or less.

Since the chamfered width $X_f$ from the wafer edge on the main surface side is thus controlled to 50 µm or more to 130 µm or less, the sharpness of the wafer edge will be suppressed when the indium phosphide substrate is polished from the back surface of the wafer to the plane A by a method such as back lapping. Therefore, it is possible to satisfactorily suppress the generation of damage such as cracks on the wafer edge, for example, during the process. Further, the chamfered width $X_b$ from the wafer edge on the back surface side is controlled to 150 µm or more to 400 µm or less. Thus, the designing of the chamfered shapes of the wafer on the main surface side and the back surface side so as to be asymmetrical and the increasing of the chamfered width of the back surface side can ensure a space for inserting a jig such as a scraper into the back surface side. Therefore, after mirror polishing, the wafer can be easily peeled off from the ceramic plate without causing chipping. The chamfered width $X_b$ from the wafer edge on the back surface side of 150 µm or more can lead to a wider space for inserting a jig such as a scraper into the back surface side, and can allow the generation of chipping to be satisfactorily suppressed. The chamfered width $X_b$ from the wafer edge on the back surface side of 400 μm or less can suppress excessive eroding of the edge shape on the back surface side of the substrate to the front surface side, ensure the chamfered width on the front surface side, and suppress disappearance of a polishing allowance. The chamfered width $X_b$ from the wafer edge on the back surface side is preferably 160 μm or more to 340 μm or less.

Also, the wafer edge may be configured to include: tapered portions formed to decrease the wafer thickness from each of the main surface side and/or the back surface side; and an edge round smoothly connected to the tapered portions. In FIG. 4, the back surface side of the indium phosphide substrate has a shape provided with the tapered portion.

In another aspect, when planes A each parallel to a main surface are taken in a wafer, the phosphide substrate according to the present embodiment has an angle θ on the main surface side of 60°<θ≤110° for all of the planes A where a distance from the main surface is 100 μm or more to 200 μm or less, wherein the angle θ is formed by a plane B, the plane B including an intersection line of an wafer edge with each of the planes A and being tangent to the wafer edge, and an plane of each of the planes A extending in a wafer outside direction; wherein in a cross section orthogonal to the wafer edge, the indium phosphide substrate has edge rounds on the main surface side and a surface side opposite to the main surface; wherein a chamfered width $X_f$ from the wafer edge on the main surface side is 80 μm or more to 110 μm or less; wherein a chamfered width $X_b$ from the wafer edge on the surface side opposite to the main surface is 150 μm or more to 210 μm or less; and wherein the indium phosphide substrate has a diameter of 50.8 mm or less and a thickness of 330 μm or more to 380 μm or less.

According to such a configuration, the sharpness of the wafer edge will be suppressed when the indium phosphide substrate having a diameter of 50.8 mm or less and a thickness of 330 μm or more to 380 μm or less is polished from the back surface of the wafer to the plane A by a method such as back lapping. Therefore, it is possible to satisfactorily suppress the generation of damage such as cracks on the wafer edge, for example, during the process. Further, the designing of the chamfered shapes of the wafer on the main surface side and the back surface side so as to be asymmetrical and the increasing of the chamfered width of the back surface side can ensure a space for inserting a jig such as a scraper into the back surface side. Therefore, after mirror polishing, the wafer can be easily peeled off from the ceramic plate without causing chipping. The chamfered width $X_b$ from the wafer edge on the back surface side of 150 μm or more can lead to a wider space for inserting a jig such as a scraper into the back surface side, and can allow the generation of chipping to be satisfactorily suppressed. The chamfered width $X_b$ from the wafer edge on the back surface side of 210 μm or less can suppress excessive eroding of the edge shape on the back surface side of the substrate to the front surface side, ensure the chamfered width on the front surface side, and suppress disappearance of a polishing allowance. The chamfered width $X_b$ from the wafer edge on the back surface side is preferably 160 μm or more to 180 μm or less.

In another aspect, when planes A each parallel to a main surface are taken in a wafer, the phosphide substrate according to the present embodiment has an angle θ on the main surface side of 90°≤θ≤120° for all of the planes A where a distance from the main surface is 100 μm or more to 200 μm or less, wherein the angle θ is formed by a plane B, the plane B including an intersection line of a wafer edge with each of the planes A and being tangent to the wafer edge, and an plane of each of the planes A extending in a wafer outside direction, wherein in a cross section orthogonal to the wafer edge, the indium phosphide substrate has edge rounds on the main surface side and a surface side opposite to the main surface; wherein a chamfered width $X_f$ from the wafer edge on the main surface side is 80 μm or more to 110 μm or less; wherein a chamfered width $X_b$ from the wafer edge on the surface side opposite to the main surface is 180 μm or more to 230 μm or less; and wherein the indium phosphide substrate has a diameter of 50.8 mm or less and a thickness of 480 μm or more to 530 μm or less.

According to such a configuration, the sharpness of the wafer edge will be suppressed when the indium phosphide substrate having a diameter of 50.8 mm or less and a thickness of 480 μm or more to 530 μm or less is polished from the back surface of the wafer to the plane A by a method such as back lapping. Therefore, it is possible to satisfactorily suppress the generation of damage such as cracks on the wafer edge, for example, during the process. Further, the designing of the chamfered shapes of the wafer on the main surface side and the back surface side so as to be asymmetrical and the increasing of the chamfered width of the back surface side can ensure a space for inserting a jig such as a scraper into the back surface side. Therefore, after mirror polishing, the wafer can be easily peeled off from the ceramic plate without causing chipping. The chamfered width $X_b$ from the wafer edge on the back surface side of 180 μm or more can lead to a wider space for inserting a jig such as a scraper into the back surface side, and can allow the generation of chipping to be satisfactorily suppressed. The chamfered width $X_b$ from the wafer edge on the back surface side of 230 μm or less can suppress excessive eroding of the edge shape on the back surface side of the substrate to the front surface side, ensure the chamfered width on the front surface side, and suppress disappearance of a polishing allowance. The chamfered width $X_b$ from the wafer edge on the back surface side is preferably 190 μm or more to 210 μm or less.

In another aspect, when planes A each parallel to a main surface are taken in a wafer, the phosphide substrate according to the present embodiment has an angle θ on the main surface side of 90°≤θ≤120° for all of the planes A where a distance from the main surface is 100 μm or more to 200 μm or less, wherein the angle θ is formed by a plane B, the plane B including an intersection line of an wafer edge with each of the planes A and being tangent to the wafer edge, and an plane of each of the planes A extending in a wafer outside direction, wherein in a cross section orthogonal to the wafer edge, the indium phosphide substrate has edge rounds on the main surface side and a surface side opposite to the main surface; wherein a chamfered width $X_f$ from the wafer edge on the main surface side is 90 μm or more to 130 μm or less; wherein a chamfered width $X_b$ from the wafer edge on the surface side opposite to the main surface is 270 μm or more to 350 μm or less; and wherein the indium phosphide substrate has a diameter of 76.2 mm or less and a thickness of 570 μm or more to 630 μm or less.

According to such a configuration, the sharpness of the wafer edge will be suppressed when the indium phosphide substrate having a diameter of 76.2 mm or less and a thickness of 570 μm or more to 630 μm or less is polished from the back surface of the wafer to the plane A by a method such as back lapping. Therefore, it is possible to satisfactorily suppress the generation of damage such as cracks on the wafer edge, for example, during the process. Further, the designing of the chamfered shapes of the wafer on the main surface side and the back surface side so as to be asymmetrical and the increasing of the chamfered width of the back surface side can ensure a space for inserting a jig such as a scraper into the back surface side. Therefore, after mirror polishing, the wafer can be easily peeled off from the ceramic plate without causing chipping. The chamfered width $X_b$ from the wafer edge on the back surface side of 270 μm or more can lead to a wider space for inserting a jig such as a scraper into the back surface side, and can allow the generation of chipping to be satisfactorily suppressed. The chamfered width $X_b$ from the wafer edge on the back surface side of 350 μm or less can suppress excessive eroding of the edge shape on the back surface side of the substrate to the front surface side, ensure the chamfered width on the front surface side, and suppress disappearance of a polishing allowance. The chamfered width $X_b$ from the wafer edge on the back surface side is preferably 280 μm or more to 340 μm or less.

In the indium phosphide substrate according to an embodiment of the present invention, a ratio of the chamfered width $X_b$ from the wafer edge on the surface side opposite to the main surface to the chamfered width $X_f$ from the wafer edge on the main surface side: $X_b/X_f$ is preferably 1.25 or more to 8.0 or less. Also, the ratio $X_b/X_f$ is preferably 1.70 or more to 3.0 or less.

[Method for Producing Indium Phosphide Substrate]

Next, a method for producing an indium phosphide substrate according to an embodiment of the present invention will be described.

The method for producing the indium phosphide substrate starts from producing an indium phosphide ingot by a known method.

The indium phosphide ingot is then ground into a cylinder.

A wafer having a main surface and a back surface is then cut out from the ground indium phosphide ingot. In this case, both ends of the crystal of the indium phosphide ingot are cut along a predetermined crystal plane using a wire saw to cut out a plurality of wafers to have a predetermined thickness.

Subsequently, in order to remove affected layers generated in the cutting step with the wire saw, both surfaces of the cut wafer are etched with a predetermined etching solution (primary etching). The wafer can be etched by immersing the entire wafer in the etching solution.

Subsequently, an outer peripheral portion of the wafer is chamfered, and at least one surface, preferably both surfaces, of the chamfered wafer is polished. The polishing step is also called a lapping step, and the wafer is polished with certain abrasives to remove irregularities on the wafer surface while maintaining the flatness of the wafer.

Both surfaces of the polished wafer are then etched with a predetermined etching solution (secondary etching). The wafer can be etched by immersing the entire wafer in the etching solution.

The main surface of the wafer is then polished with an abrasive material for mirror polishing to finish it into a mirror surface while attaching a plate such as a ceramic plate to the back surface of the wafer. Further, when both surfaces of the wafer are mirror-polished, polishing is carried out by rotating and revolving the wafer while sandwiching it between upper and lower surface plates, and then the polishing may be carried out while attaching the wafer to the ceramic plate or the like using the same method as described above for the purposes of reducing processing damage during the polishing of the both surfaces and removing minute scratches on the surface.

Subsequently, a jig such as a scraper is inserted into the back surface side to peel off the plate.

The resulting polished wafer is then washed to produce an indium phosphide substrate according to an embodiment of the present invention.

In the indium phosphide substrate according the present embodiment, to control the angle θ on the main surface side formed by the plane B which is tangent to the wafer edge as described above, and the plane of each of the planes A extending in the wafer outside direction for all the planes A where the distance from the main surface is in the predetermined range, the shape of the wafer edge may be controlled by adjusting a chamfered amount as appropriate based on an amount of the wafer to be cut during the lapping, etching, and polishing as described above. More particularly, the chamfered amount (chamfered width from the wafer edge) on the main surface side of the wafer is in the range of from 150 to 320 μm, and the chamfered amount on the back surface side is in the range of 320 to 580 μm. Also, the removal is carried out such that the removed (polished) amount on the main surface side of the chamfered wafer is in the range of 80 μm or less in the wafer thickness direction, and the removed amount on the back surface side is in the range of 70 μm or less in the wafer thickness direction, so that for all the planes A where the distance from the main surface is in the defined range, each angle θ on the main surface side formed by the plane B which is tangent to the wafer edge as described above, and the plane of each of the planes A extending in the wafer outside direction can be controlled as needed. Further, the generation of chipping on the back surface side can be suppressed when the wafer is peeled off from the ceramic plate or the like, which has been attached to the back surface side of the wafer.

[Semiconductor Epitaxial Wafer]

By epitaxially growing a semiconductor thin film onto the main surface of the indium phosphide substrate according to the embodiment of the present invention by a known method, an epitaxial crystal layer can be formed to produce a semiconductor epitaxial wafer. As an example of the epitaxial growth, an InAlAs buffer layer, an InGaAs channel layer, an InAlAs spacer layer and an InP electron supply layer may be epitaxially grown onto the main surface of the indium phosphide substrate to form a HEMT structure. When producing a semiconductor epitaxial wafer having such a HEMT structure, in general, a mirror-finished indium phosphide substrate is etched with an etching solution such as sulfuric acid/hydrogen peroxide solution to remove impurities such as silicon (Si) adhering to the substrate surface. The back surface of the etched indium phosphide substrate is brought into contact with the susceptor and supported, and in this state, an epitaxial film is formed on the main surface of the indium phosphide substrate by molecular beam epitaxy (MBE) or metal organic chemical vapor deposition (MOCVD).

EXAMPLES

Hereinafter, Examples are provided for better understanding of the present invention and its advantages. However, the present invention is not limited to these Examples.

Examples 1 to 4 and Comparative Examples 1 to 2 were prepared as follows:

First, ingots of indium phosphide monocrystals grown with a predetermined diameter were prepared.

An outer circumference of each ingot of indium phosphide monocrystals was ground into a cylinder.

A wafer having a main surface and a back surface was cut out from the ground indium phosphide ingot. In this case, both ends of the crystal of the indium phosphide ingot were cut along a predetermined crystal plane using a wire saw to cut out a plurality of wafers to have a predetermined thickness. In the step of cutting out the wafer, a new wire was continuously delivered while reciprocating the wire, and the indium phosphide ingot was moved toward a wire saw.

Subsequently, in order to remove affected layers generated in the cutting step with the wire saw, the cut wafer was etched from both sides with a mixed solution of 85% by mass of an aqueous phosphoric acid solution and 30% by mass of a hydrogen peroxide solution (primary etching). The wafer was etched by immersing the entire wafer in the etching solution.

Subsequently, an outer peripheral portion of the wafer was chamfered. Both surfaces of the chamfered wafer were then polished (lapped). In this case, the wafer was polished with abrasives to remove irregularities on the wafer surface while maintaining the flatness of the wafer.

Both surfaces of the polished wafer was then etched with a mixed solution of 85% by mass of an aqueous phosphoric acid solution, 30% by mass of a hydrogen peroxide solution and ultrapure water (secondary etching). The wafer was etched by immersing the entire wafer in the etching solution.

The main surface of the wafer was then polished with abrasives for mirror polishing to finish it into a mirror surface while attaching a ceramic plate to the back surface of the wafer. Also, for some wafers, after polishing the both surfaces by rotating and revolving the wafer while sandwiching it between upper and lower surface plates, the polishing was carried out while attaching the ceramic plate to the back surface of the wafer using the same method as described above for the purposes of reducing processing damage during the polishing of the both surfaces and removing minute scratches on the surface. Subsequently, a jig such as a scraper was inserted into the back surface side to peel off the plate. Subsequently, washing was carried out to produce an indium phosphide substrate.

Figure 5:
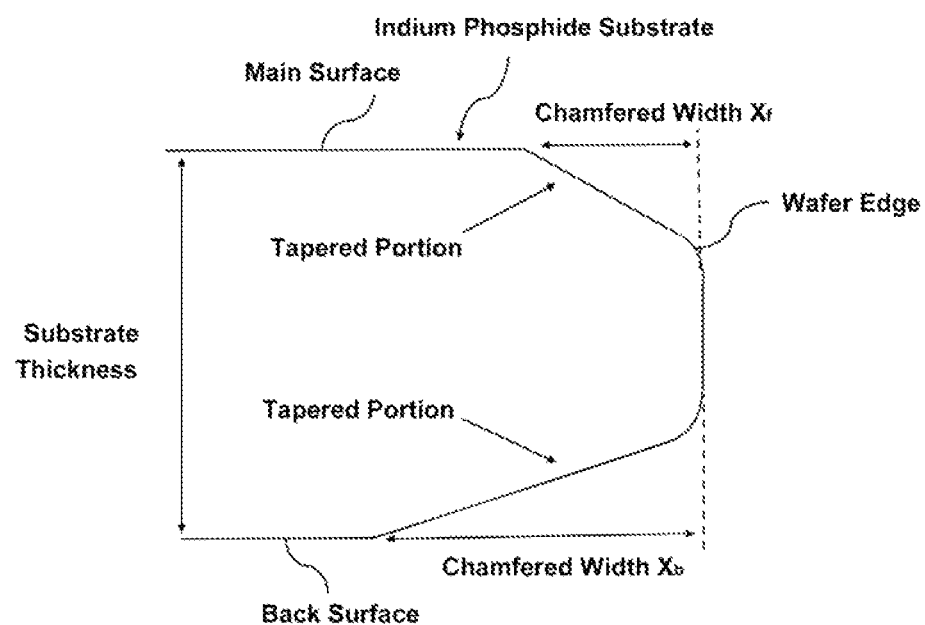
FIG. 5 is a schematic cross-sectional view of an indium phosphide substrate of Example near a wafer edge.

In Examples 1 to 4, each wafer production is adjusted such that when the planes A parallel to the main surface of the wafer are taken in the wafer, the angle θ formed by the plane B, which includes the intersection line of the wafer edge with each of the planes A and is tangent to the wafer edge, and the plane of each of the planes A extending in the wafer outside direction is in the defined range for the plane A at the predetermined distance from the main surface. Also, each wafer production was adjusted such that each of the chamfered widths $X_f$, $X_b$ from the wafer edges of the front surface and the back surface was in the defined range. For each wafer shape in Table 1, reference may be made to the schematic cross-sectional view near the wafer edge of the indium phosphide substrate as shown in FIG. 5.

(Evaluation)

Each of the edges of the wafers according to Examples 1 to 4 and Comparative Examples 1 to 2 were measured using Wafer Edge Profile Checker (EPRO-212EO from YUHI ELECTRONICS). Each of the angles ($\theta_1$, $\theta_2$, $\theta_3$) was calculated by drawing a straight line A parallel to the main surface (corresponding to the plane A), which corresponded to the thickness after back lapping, drawing a tangent line B where a contact point of the straight line A with the wafer edge was a tangent point (corresponding to plane B), and determining the angle formed by the straight line A and the tangent line B.

The shapes of the wafers produced, and the above evaluation results of the wafers are shown in Table 1.

TABLE 1

| | | Example 1 | Example 2 | Example 3 | Example 4 | Comp. 1 | Comp. 2 |
|---|---|---|---|---|---|---|---|
| Wafer Shape | Wafer Diameter (mm) after Cutting with Wire Saw | 50.0 | 50.0 | 76.2 | 76.2 | 50.0 | 76.2 |
| | Wafer Thickness (μm) after Cutting with Wire Saw | 357 | 502 | 596 | 602 | 360 | 630 |
| | Chamfered Width $X_f$ (μm) from Wafer Edge of Front Surface | 96 | 75 | 113 | 105 | 118 | 85 |
| | Chamfered Width $X_b$ (μm) from Wafer Edge of Back Surface | 162 | 207 | 334 | 281 | 109 | 50 |
| | Ratio: $X_b/X_f$ | 1.7 | 2.8 | 3.0 | 2.7 | 0.9 | 0.6 |
| | Angle $\theta_f$ (°) Formed by Main Surface and Wafer Edge | 45 | 50 | 43 | 45 | 30 | 53 |
| | Angle $\theta_b$ (°) Formed by Back Surface and Wafer Edge | 32 | 28 | 23 | 24 | 35 | 53 |
| Chipping Evaluations | Number of Introduction to Steps (Number of Samples) | 49 | 37 | 38 | 59 | 31 | 15 |
| | Percentage (%) of Chipping Generated on Back Surface Side | 0 | 0 | 0 | 0 | 41.9 | 73.3 |
| Wafer Evaluations | Wafer Thickness (μm) after Back Lapping | 150 | 150 | 150 | 150 | 150 | 150 |
| | Angle $\theta_1$ (°) Formed by Plane B Tangent to Wafer Edge and Plane Extending in Wafer Outer Direction of Plane A (Distance from Main Surface of 100 μm) on Main Surface Side | 110 | 111 | 117 | 116 | 117 | 106 |
| | Angle $\theta_2$ (°) Formed by Plane B Tangent to Wafer Edge and Plane Extending in Wafer Outer Direction of Plane A (Distance from Main Surface of 200 μm) on Main Surface Side | 60 | 90 | 99 | 96 | 81 | 90 |
| | Angle $\theta_3$ (°) Formed by Plane B Tangent to Wafer Edge and Plane Extending in Wafer Outer Direction of Plane A (Position of Back Surface After Back Lapping) on Main Surface Side | 90 | 90 | 102 | 104 | 101 | 97 |

In each of the substrates according to Examples 1 to 4, the sharpness of the wafer edge after removing the back surface was well suppressed, and a percentage of chipping generated on the back surface side was 0% when the wafer was peeled off from the ceramic plate after mirror polishing. However, in each of the substrates according to Comparative Examples 1 and 2, the sharpness of the wafer edge after removing the back surface could be suppressed, but the percentage of chipping generated on the back surface side was higher when the wafer was peeled off from the ceramic plate after mirror polishing.

In addition, the chipping on the back surface is affected only by two factors: the chamfered width $X_b$ from the wafer edge on the back surface and the wafer thickness. Therefore, it is believed that even for wafers having larger diameters than those of Examples 3 and 4, the generation of chipping can be suppressed by similarly controlling only the two factors: the chamfered width $X_b$ and the wafer thickness.

The invention claimed is:

1. An indium phosphide substrate,
wherein when planes A each parallel to a main surface are taken in a wafer, the phosphide substrate has an angle θ on the main surface side of 0°<θ≤120° for all of the planes A where a distance from the main surface is 100 μm or more to 200 μm or less, wherein the angle θ is formed by a plane B, the plane B including an intersection line of an wafer edge with each of the planes A and being tangent to the wafer edge, and an plane of each of the planes A extending in a wafer outside direction;
wherein in a cross section orthogonal to the wafer edge, the indium phosphide substrate has edge rounds on the main surface side and a surface side opposite to the main surface;
wherein a chamfered width $X_f$ from the wafer edge on the main surface side is 50 μm or more to 130 μm or less;
wherein a chamfered width $X_b$ from the wafer edge on the surface side opposite to the main surface is 150 μm or more to 400 μm or less; and
wherein the indium phosphide substrate has a thickness of 330 μm or more to 700 μm or less.

2. The indium phosphide substrate according to claim 1, wherein the angle θ is 60°≤θ≤120° for all of the planes A where the distance from the main surface is 100 μm or more to 200 μm or less.

3. An indium phosphide substrate,
wherein when planes A each parallel to a main surface are taken in a wafer, the phosphide substrate has an angle θ on the main surface side of 60°<θ≤110° for all of the planes A where a distance from the main surface is 100 μm or more to 200 μm or less, wherein the angle θ is formed by a plane B, the plane B including an intersection line of an wafer edge with each of the planes A and being tangent to the wafer edge, and an plane of each of the planes A extending in a wafer outside direction;
wherein in a cross section orthogonal to the wafer edge, the indium phosphide substrate has edge rounds on the main surface side and a surface side opposite to the main surface;
wherein a chamfered width $X_f$ from the wafer edge on the main surface side is 80 μm or more to 110 μm or less;
wherein a chamfered width $X_b$ from the wafer edge on the surface side opposite to the main surface is 150 μm or more to 210 μm or less; and
wherein the indium phosphide substrate has a diameter of 50.8 mm or less and a thickness of 330 μm or more to 380 μm or less.

4. An indium phosphide substrate,
wherein when planes A each parallel to a main surface are taken in a wafer, the phosphide substrate has an angle θ on the main surface side of 90°≤θ≤120° for all of the planes A where a distance from the main surface is 100 μm or more to 200 μm or less, wherein the angle θ is formed by a plane B, the plane B including an intersection line of a wafer edge with each of the planes A and being tangent to the wafer edge, and an plane of each of the planes A extending in a wafer outside direction,
wherein in a cross section orthogonal to the wafer edge, the indium phosphide substrate has edge rounds on the main surface side and a surface side opposite to the main surface;
wherein a chamfered width $X_f$ from the wafer edge on the main surface side is 80 μm or more to 110 μm or less;
wherein a chamfered width $X_b$ from the wafer edge on the surface side opposite to the main surface is 180 μm or more to 230 μm or less; and
wherein the indium phosphide substrate has a diameter of 50.8 mm or less and a thickness of 480 μm or more to 530 μm or less.

5. An indium phosphide substrate,
wherein when planes A each parallel to a main surface are taken in a wafer, the phosphide substrate has an angle θ on the main surface side of 90°≤θ≤120° for all of the planes A where a distance from the main surface is 100 μm or more to 200 μm or less, wherein the angle θ is formed by a plane B, the plane B including an intersection line of an wafer edge with each of the planes A and being tangent to the wafer edge, and an plane of each of the planes A extending in a wafer outside direction,
wherein in a cross section orthogonal to the wafer edge, the indium phosphide substrate has edge rounds on the main surface side and a surface side opposite to the main surface;
wherein a chamfered width X from the wafer edge on the main surface side is 90 μm or more to 130 μm or less;
wherein a chamfered width $X_b$ from the wafer edge on the surface side opposite to the main surface is 270 μm or more to 350 μm or less; and
wherein the indium phosphide substrate has a diameter of 76.2 mm or less and a thickness of 570 μm or more to 630 μm or less.

6. The indium phosphide substrate according to claim 1, wherein a ratio of the chamfered width $X_b$ from the wafer edge on the surface side opposite to the main surface to the chamfered width $X_f$ from the wafer edge on the main surface side: $X_b/X_f$ is 1.25 or more to 8.0 or less.

7. The indium phosphide substrate according to claim 6, wherein the ratio $X_b/X_f$ is 1.70 or more to 3.0 or less.

* * * * *